United States Patent [19]

Tsang

[11] 4,376,300
[45] Mar. 8, 1983

[54] MEMORY SYSTEM EMPLOYING MOSTLY GOOD MEMORIES

[75] Inventor: Siu K. Tsang, San Jose, Calif.

[73] Assignee: Intel Corporation, Santa Clara, Calif.

[21] Appl. No.: 221,316

[22] Filed: Jan. 2, 1981

[51] Int. Cl.³ .............................................. G11C 11/40
[52] U.S. Cl. ..................................... 365/200; 371/10
[58] Field of Search ................. 365/189, 200, 210; 371/10, 11, 21

[56] References Cited

U.S. PATENT DOCUMENTS

| | | | |
|---|---|---|---|
| 3,845,476 | 10/1974 | Boehm ................................. | 365/200 |
| 4,047,163 | 9/1977 | Choate et al. ......................... | 371/11 |
| 4,250,570 | 2/1981 | Tsang et al. ......................... | 365/200 |
| 4,310,901 | 1/1982 | Harding et al. ..................... | 365/200 |

*Primary Examiner*—Joseph A. Popek
*Attorney, Agent, or Firm*—Blakely, Sokoloff, Taylor & Zafman

[57] ABSTRACT

A memory system is described which employs a plurality of "mostly good" memory chips. A redundant memory chip is used to store data designated to the defective locations in the mostly good memories. In one embodiment a PROM is programmed to recognize the addresses of the defective elements and to cause the redundant memory to be selected. In another embodiment, a content-addressable memory is employed to provide a new address in response to the addresses of defective elements in the mostly good memories.

13 Claims, 4 Drawing Figures

MEMORY SYSTEM EMPLOYING MOSTLY GOOD MEMORIES

BACKGROUND OF THE INVENTION

1. Field of the Invention

The invention relates to the field of memory systems which include a plurality of memory "chips", particularly memory systems employing "mostly good" memory chips.

2. Prior Art

During the fabrication of memory chips, many such memories are formed which are "mostly good". That is, memories are fabricated having only a few faulty elements such as a faulty cell, line, decoder, etc. Typically in the fabrication of MOS memories, most defective memories (chips) have fewer than 10 bad elements. When memory chips are fabricated with redundant elements, more "perfect" memories result when redundant elements are used. However, the redundancy also provides more mostly good memories. For example, if a memory has 3 defective rows, and there are four redundant rows that may be used to replace the defective rows, a perfect memory results, at least from the user's standpoint. If another memory has six defective rows, the use of the four redundant rows only results in a mostly good memory.

It has been the practice in the semiconductor industry to use mostly good memories for fabricating memory systems. In one scheme, the mostly good memories are sorted into memories having $\frac{1}{4}$, $\frac{1}{2}$ or $\frac{3}{4}$ usable memory capacity which falls into predetermined address ranges. Then, by way of example, a memory system is fabricated using memories with $\frac{1}{2}$ usable capacity where the usable capacity falls within the same address range. Obviously, with this scheme, it is necessary to stock a large number of different mostly good memories. Moreover, many mostly good memories cannot be used with this sorting scheme since the usable capacity may not fall within predetermined address ranges. The above described sorting does not provide good utilization of mostly good memories. For example, a memory having three defective elements could be classified as only having $\frac{1}{4}$ usable capacity, depending upon the addresses at which the defective elements are located. A single defective element could cause a mostly good memory to be classified as having only $\frac{1}{2}$ usable capacity again depending on the location of the defective element. As will be seen, the present invention greatly reduces the sorting problems described above, and more importantly, permits much better utilization of the usable capacity of mostly good memories. In general, with the present invention, a redundant memory chip is used with addressing means which cause selection of the redundant memory when an address is received by the memory system corresponding to a defective element in a mostly good memory.

Applicant has conducted a search; the following patents were uncovered during the search:

| U.S. Pat. No. | Patentee | Issue Year |
| --- | --- | --- |
| 3,350,690 | Rice | 1967 |
| 3,772,652 | Hilberg | 1973 |
| 3,803,560 | DeVoy et al | 1974 |
| 3,995,261 | Goldberg | 1976 |
| 3,999,051 | Petschauer | 1976 |
| 4,051,354 | Choate | 1977 |

| U.S. Pat. No. | Patentee | Issue Year |
| --- | --- | --- |
| 4,051,460 | Yamada et al | 1977 |
| 4,066,880 | Salley | 1978 |
| 4,092,733 | Cootnz, et al | 1978 |

SUMMARY OF THE INVENTION

In one embodiment, the mostly good memories are first sorted into groups having only either defective columns or defective rows. Memories from one group are used in a memory system which receives first and second address signals for accessing first and second lines, respectively, in the mostly good memories. The system includes a plurality of the mostly good memories, each having defective first lines which are accessed by different first address signals. A programmable memory is programmed to provide a predetermined output signal upon receipt of each of the different first address signals which address the defective elements. An additional memory which also receives the first address signals is coupled to the output bus of the memory system. A selection means for selecting between the mostly good memories and this additional memory is controlled by the predetermined outputs of the programmable memory. In this manner, a plurality of mostly good memories may be used in the memory system.

DETAILED DESCRIPTION OF THE INVENTION

A memory system is described which employs a plurality of mostly good memories. In the following description, numerous specific details are set forth such as specific address lengths, etc. in order to provide a thorough understanding of the present invention. It will be obvious, however, to one skilled in the art that the present invention may be practiced without these specific details.

Figure 1:
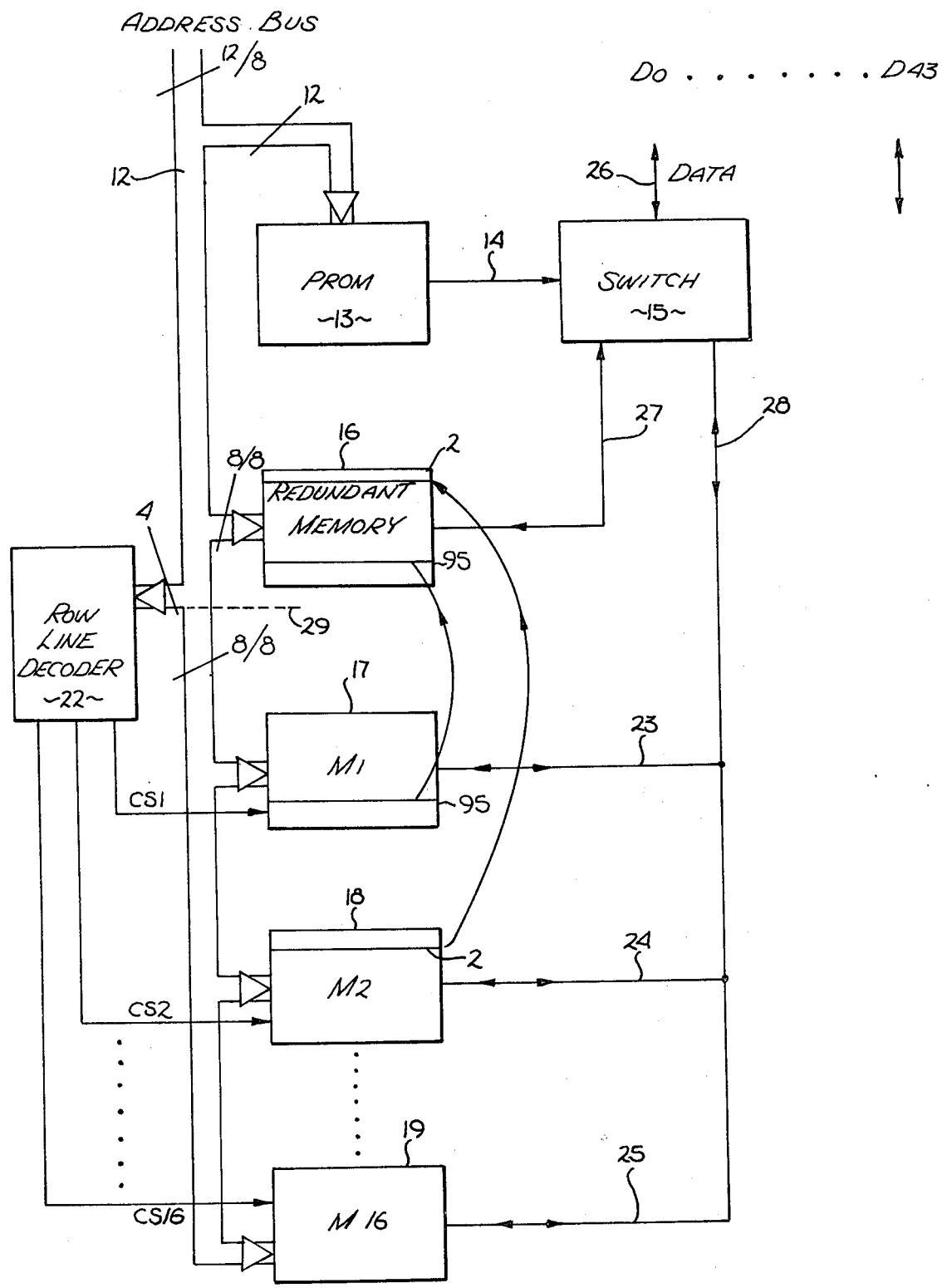
FIG. 1 is a block diagram of a memory system built in accordance with the present invention. In this embodiment, the mostly good memories are sorted into groups having only defective rows or defective columns.

Referring now to FIG. 1 and ignoring for a moment the PROM 13, memory 16, and switch 15, the remaining devices form a portion of a memory system. The system includes memories (chips) 17, 18 and 19 (M1, M2 and M16, respectively). Memories M3 through M15, not illustrated, are disposed between the memories 18 and 19. For sake of discussion, assume that the memories 17 through 19 are organized as X1 memories, (that is, a single bit output for each complete address) and that 8 address bits are needed to select a row in a memory and 8 address bits are needed to select a column in a memory. (A typical commercially available 64K memory fits this example, such as Part No. 2164.

The memory system receives the address bits on the address bus 12. This bus includes 12 lines above dotted line 29 and eight lines below line 29. Four lines of the bus are coupled to decoder 22, and the other 8 lines to each of the memories 17 through 19. As is often done, the address signals are multiplexed on the address bus 12 thus, for example, row addresses are first coupled to the memory system followed by the column addresses.

The four address bits coupled to the system row line decoder 22 are decoded to provide the chip select signals, CS1 through CS16. These signals cause selection of only one of the memories M1 through M16 for each complete address (20 bits). Thus, only a single output occurs from the memories for each complete address (i.e., an output on line 23, 24 or 25.)

In a typical memory system, 22 columns of memories such as memories 17, 18 and 19 are arranged on a single printed circuit board. Thus, for each complete address applied to the board on bus 12, a 22 word output (D0-D43) occurs. The address bus 12 and chip select signals from decoder 22 are coupled to each column of the memories.

The above described memory, of course, may be fabricated with all perfect memory chips or may be designed to operate as described in the prior art section of this application with mostly good memories. For example, one less higher order address signal would be used to prevent selection of faulty elements in "½ good" memories.

Assume now that the memory of FIG. 1 is to operate with mostly good memories in accordance with the teachings of the present invention. Assume further that these memories have only defective rows. An additional memory 16 which may be identical to memories 17, 18 or 19 is coupled to the bus 12 and receives the multiplexed 16-bit address signal. (While not necessary, for purposes of explanation it is assumed that memory 16 is a perfect memory.) The memory 16 does not receive a signal from the decoder 22, this memory is selected each time any of the memories are selected in the column below it.

A programmable read-only memory, PROM 13, receives 12-bits of the complete address from the address bus 12. For the described embodiment, this memory receives the row address (8-bits) and the 4-bit address coupled to the decoder 22. An output line 14 from the PROM 13 is coupled to a switch 15. Depending upon the state of the binary signal on line 14, the switch 15 selects either the line 27 or line 28 and couples the selected line to line 26, an output line from the memory system. Thus, the switch 15 is, in effect, a single sole, double throw switch, although in the presently preferred embodiment, it is implemented as a solid state switch.

Assume that the memory 17 has a defective row 95. Since PROM 13 receives the above-described 12-bits of address, it is able to recognize that row 95 of memory 17 is being addressed. In fact PROM 13 is programmed such that when row 95 of memory 17 is selected, an output signal occurs on line 14, causing switch 15 to select memory 16. Since the same address signals are applied to the redundant memory 16, row 95 of memory 16 is selected and this row is coupled through line 27 to the data line 26. If all the other rows of memory 17 are operative, memory 17 is used (except when row 95 is selected).

In a similar manner, if row 2 of memory 18 is defective, the PROM 13 is programmed to select an output from memory 16, when the address corresponding to row 2 of memory 18 is present on the bus 12. By proper programming of the PROM 13, data may be read from and written into the redundant memory 16 effectively bypassing the defective rows in the mostly good memories.

With the system of FIG. 1, care must be taken to assure that none of the memories 17 through 19 have the same defective rows. That is, by way of example, a memory 19 cannot be used which has a defective row 2. The reason for this is that the row 2 of the redundant memory already has been used to replace the row 2 of memory 18. Thus, in selecting the mostly good memories for the system of FIG. 1, the limitation that the memories used in a particular column must have different defective rows (or columns) must be be observed.

For repairing the memory of FIG. 1, perfect memories are used, for example, a perfect memory is used to replace memory 17. This eliminates the need to determine which rows of each of the mostly good memories are defective (although this information is stored in the PROM 13).

Typical commercial PROMs such as used for PROM 13, provide an 8-bit output for each 12-bit address. Each of the outputs of the PROM may be used to control the different switches (such as switch 15) associated with each column of memories for a memory system. Thus, a single PROM 13 may control the 8 switches associated with 8 columns of mostly good memories. Where the memory system has a 22-bit output only 3 PROMs 13 are required. (Note, each column of memories in the memory system includes a redundant memory such as memory 16.)

For the described embodiment, it is assumed that the mostly good memories employed in FIG. 1 for memories 17, 18 and 19 have only defective rows. It will be apparent to one skilled in the art that the memory system may be readily implemented with memories having only defective columns. Also, each of the memories can include redundant elements.

Figure 2:
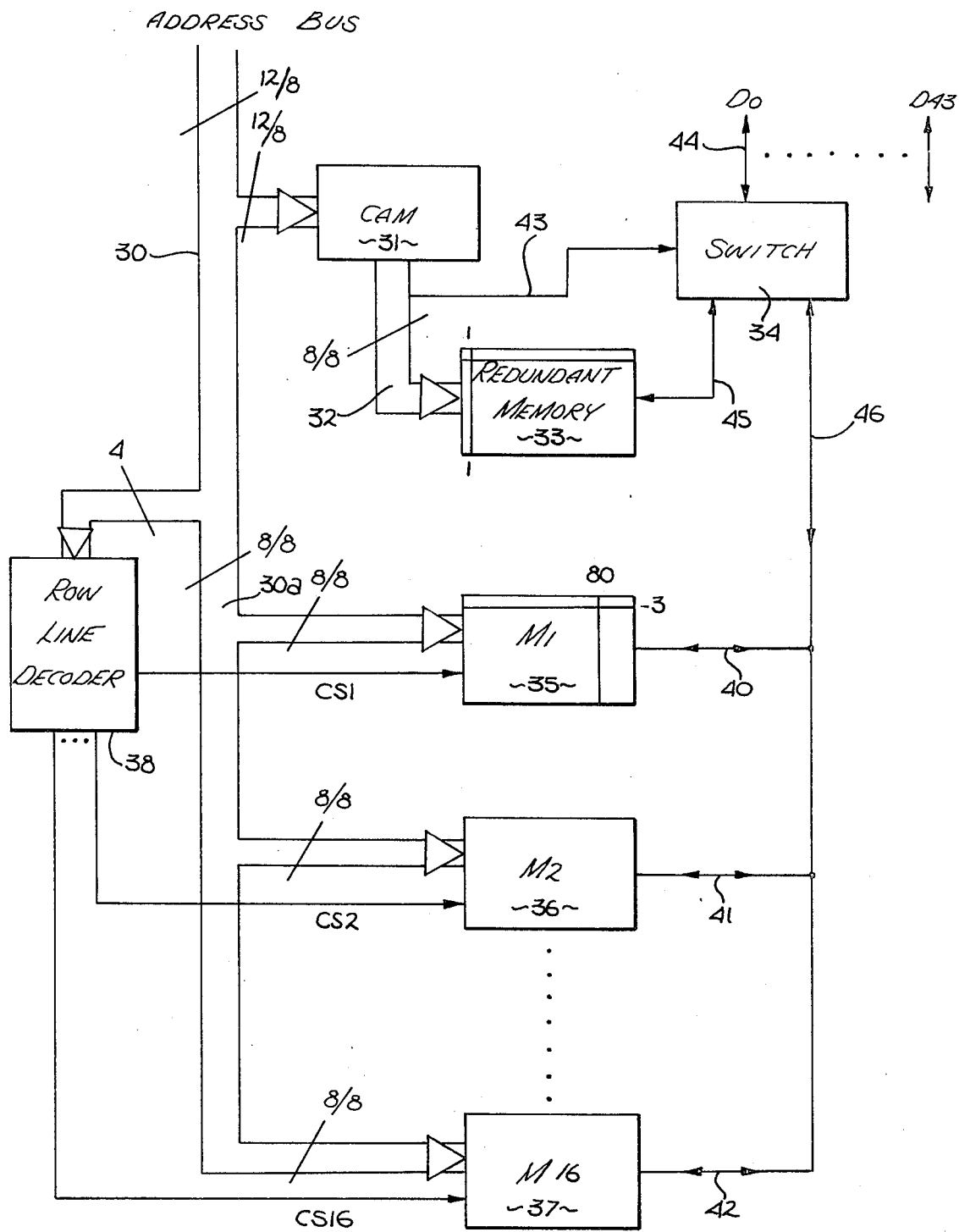
FIG. 2 is a block diagram of another memory system built in accordance with the present invention. With this embodiment the mostly good memories need not be sorted into groups having only defective rows or columns.

Referring now to FIG. 2, the memories 35, 36 and 37, the decoder 38, bus 30 and switch 34 are arranged in an identical manner to the corresponding memories, decoder and switch of FIG. 1.

For this embodiment, all the address signals on bus 30 are coupled to a content-addressable memory, CAM 31. The CAM 31 for predetermined addresses on bus 30, provides an output which is used as a new address, this new address being coupled by the bus 32 to a redundant memory 33. One bit of the output from the CAM 31 is coupled by line 43 to the switch 34 to control the switch 34. Again, the switch 34 selects between either the lines 45 or line 46 and couples one of these lines to line 44. Line 46 is coupled to line 40, 41, and 42.

Unlike the embodiment of FIG. 1, in FIG. 2 the redundant memory 33 may have any convenient capacity; it may for example be of much smaller capacity than the memories 35, 36 and 37.

The CAM 31 may use any one of a plurality of known circuits for content-addressable memories employing EPROM devices or the like. The CAM 31 may be a more readily programmable memory device, which is programmed each time the memory system is powered-up. A bootstrap program which, as will be explained for the more programmable memory, contains the addresses of defective elements in the memories is read into CAM 31 when the system is powered-up.

Assume for sake of discussion that the memory 35 has a defective cell located at row 3, column 80. The CAM 31 is programmed to recognize the address of row 3, column 80 of the memory 35. When the CAM 31 detects this address, it furnishes an output which causes the switch 34 to select memory 33 and provides an address to the memory 33. The number of bits in this address will be a function of the size of the memory 33 since any size memory may be selected for the redundant memory 33. By way of example, the address coupled on bus 32 to memory 33 could select a cell at column 1, row 1 to replace the defective element of memory 35.

With the above-described addressing apparatus, the redundant memory 33 need only have a capacity equal to (or larger than) the number of defective elements in the memories M1-M16. Thus, in a typical application, memory 33 may have relatively small capacity (e.g., 1K memory) even where memories M1, M2 and M16 are 64K memories. Unlike the previous embodiment, no sorting is necessary since the CAM 31 can be programmed to recognize every location in each of the memories. Importantly, the CAM 31 is much more economical in terms of the amount of circuitry required than a PROM. The CAM 31 need only recognize a number of addresses corresponding to the capacity of memory 33.

For the case where the CAM 31 is more readily programmable, during the assembly of the memory system, the faulty elements in the mostly good memories are noted and a program written to assure that the CAM 31 recognizes these address and selects a location in memory 33 for each faulty element. This program is stored in a non-volatile memory, such as those used as part of a computer system. When the computer system is turned-on, this program is read into CAM 31 and the memory system is then able to function. One advantage to this, is that if additional failures occur in the mostly good memories, the CAM 31 can be programmed to recognize the addresses of newly failed element, and the redundant memory used to replace the newly failed element. (Spare capacity in the CAM 31 and memory 33 are therefore advisable.) Thus, repairs can be made simply by adding to the program read into CAM 31.

For purposes of explanation for FIGS. 1 and 2, a switch such as switch 15 of FIG. 1 and switch 34 of FIG. 2 is used to select among the memories. In the presently preferred embodiment, the equivalent of a switch is used, however, selection is made among the memories by controlling one of the timing signals which is applied to the memories.

Figure 4:
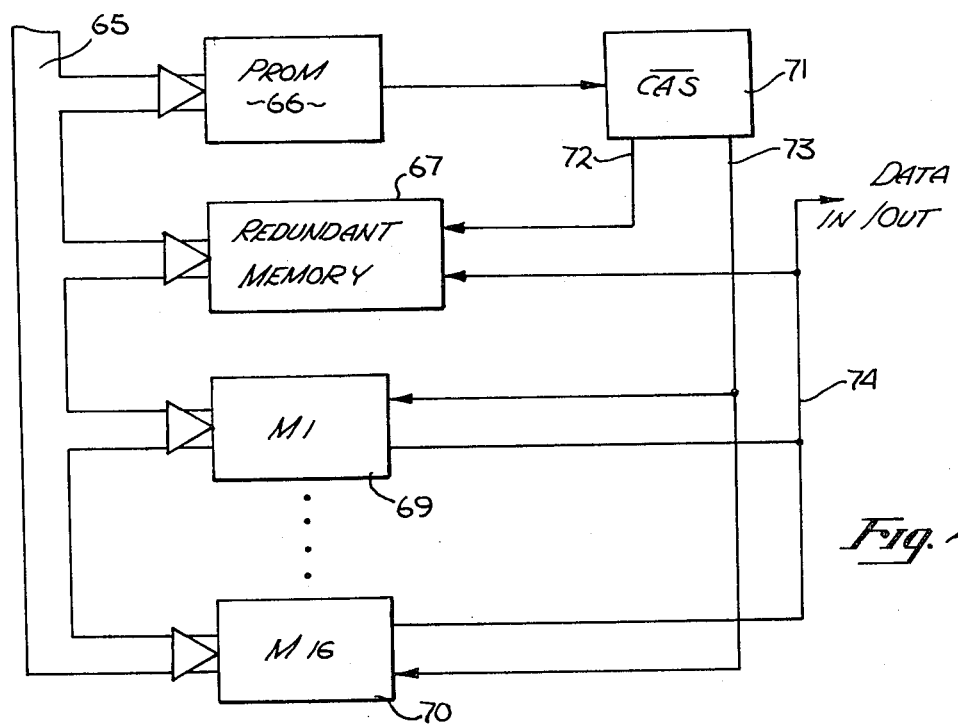
FIG. 4 is a block diagram of the presently preferred embodiment of the present invention where the CAS/ (column address signal) is used to select memories.

Referring to FIG. 4, the memory system equivalent to that of FIG. 1 is again shown and includes an address bus 65, redundant memory 67 and mostly good memories 69 and 70, with memories M2 through M15 not illustrated. In the presently preferred embodiment, all the output lines from the memories including the redundant memory 67 are coupled directly to the data line 74. To simplify the explanation for the embodiment of FIG. 4, the row line decoder 22 of FIG. 1 is not illustrated.

In many commercial dynamic RAMs the column address signals and row address signals are multiplexed and applied to the memories in conjunction with timing signals referred to as the CAS/ and RAS/ signals. The memory system includes driver circuits for generating these address timing signals and for applying them to the memories in a memory system. In the presently preferred embodiment, the output from the PROM 66 (which is identical to the PROM 13 of FIG. 1) is used to control the distribution of the CAS/ signal. When the PROM 66 detects that a defective element is being selected in one of the mostly good memories, the CAS/ signal is applied to the redundant memory 67. This prevents the mostly good memories from being selected. If, on the other hand, the selected element in the memories M1 through M16 is not defective, the CAS/ signals are applied to the mostly good memories rather than the redundant memory 67. Thus, in effect, the PROM 66 controls the selection among the memories by controlling the CAS/ signal. The advantage to controlling the CAS/ signal as opposed, for example, to using the switch at the output lines such as in FIG. 1, is that less power is consumed for the embodiment of FIG. 4. When the redundant memory 67 is selected, substantially less power is consumed in the memories M1 through M16 since the CAS/ signal is not applied to these memories.

As is apparent, the selection among the memories by controlling the distribution of the CAS/ signal may also be used for the embodiment of FIG. 2.

Figure 3:
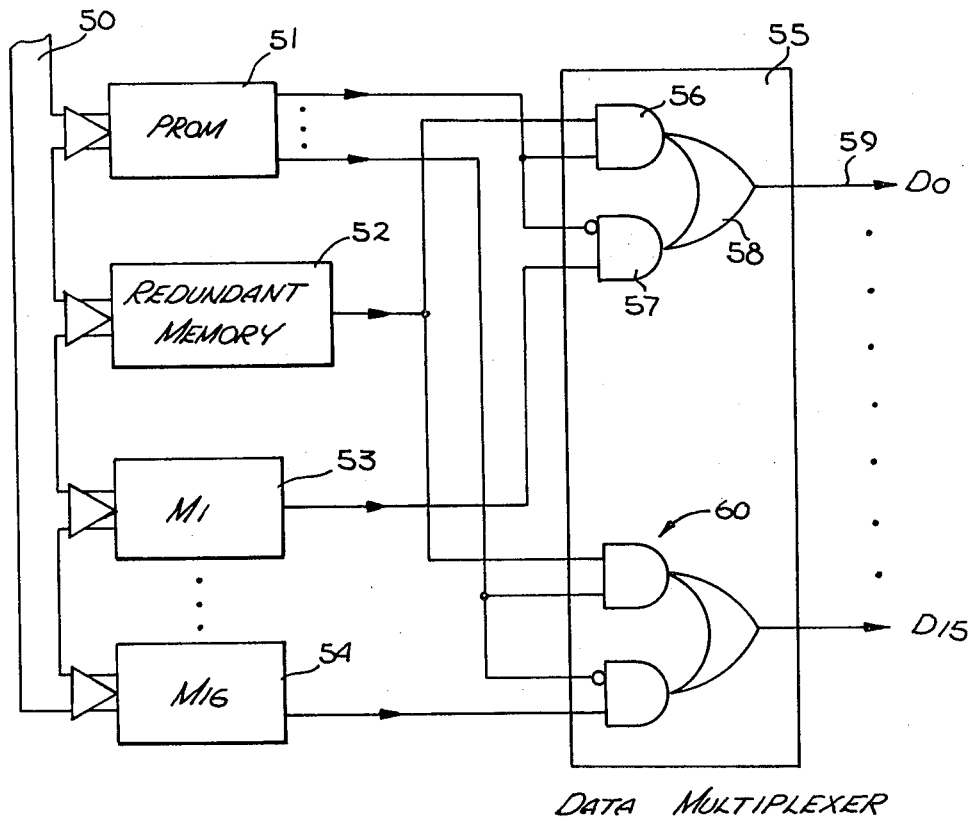
FIG. 3 is a block diagram of the present invention when used in an alternate memory system.

The present invention may be employed in a memory system where a plurality of memories in a single column or row are simultaneously accessed. Referring to FIG. 3, assume that a memory system includes memories M1 through M16 (memories 53 and 54 are illustrated). These memories communicate with the data lines $D_0$ through $D_{15}$ respectively. Without the improvement of the present invention, address signals on the address bus 50 simultaneously directly access the memories M1 through M16 on the lines $D_0$ through $D_{15}$, respectively. With the improvement of the present invention, once again, mostly good memories may be employed for the memories M1 through M16. The PROM 51 receives all the address bits which are coupled to the mostly good memories and provides an output. The number of bits in this output equals or exceeds the number of memories M1 through M16. Thus, for the described embodiment, the PROM 51 has an output of 16 bits. Note that where commercial PROMs are used which have an output of 8 bits, two PROMs are used in parallel.

Selection between the redundant memory 52 and the memories M1 through M16 is done by the data multiplexer 55. Associated with each of the mostly good memories is a dating network such as network 60 which selects between the redundant memory and the networks' respective mostly good memory. For example, the data line from memory 53 is coupled to one input terminal of an AND gate 57. The output from the redundant memory 52 is coupled to one input terminal of an AND gate 56 (and like gates). One output line from the PROM 51 is inverted and coupled to the other input terminal of the AND gate 57, and this line is coupled directly to the other input terminal of the AND gate 56. The outputs of the AND gates 56 and 57 are coupled to a NOR gate 58 and the output of this NOR gate provides one of the data lines, line 59.

Assume for a predetermined address, memory M1 has a defective element. The PROM 51 is programmed to recognize this address and to provide a high output on the line coupled to the gates 56 and 57 upon receipt of this address. The high output from the PROM 51 through the gate 57 prevents the output from memory 53 from being coupled to the line 59. On the other hand, the high output from the PROM 51 allows the output from the memory 52 to be coupled through gate 56 and the NOR gate 58 to the output line 59. Thus, through use of the data multiplexer of FIG. 3, the PROM 51 allows the redundant memory 52 to replace defective elements in the memories M1 through M16. Note that for the embodiment of FIG. 3, as in the embodiment of FIG. 1, the memories M1 through M16 cannot have defective elements which are accessed by the same address.

Thus, a memory system has been described which uses mostly good memory chips. The amount of sorting and number of parts required to be stocked, is reduced when compared to prior art memory systems employing mostly good memories. Also, the invented memory systems better utilize the mostly good memories, when compared to prior art systems.

I claim:

1. In a memory system employing a plurality of memories, each of which are coupled to receive first and second address signals for accessing first and second lines, respectively in said memories, an improvement for permitting use of ones of said memories having defective elements, comprising:

a plurality of said memories, each having defective first lines which are accessed by different first address signals, said memories coupled to receive said first and second address signals;

a programmable memory, programmed to provide a predetermined output signal upon receipt of each of said different first address signals, said programmable memory coupled to receive said first address signals;

an additional memory, coupled to receive said first address signals; and, a selection means for selecting signals such that said additional memory is selected when said defective first lines are accessed, said selection means coupled to said memories and said additional memory, said selection means being controlled by said predetermined output signal from said programmable memory so as to cause selection of said additional memory, whereby a plurality of mostly good memories may be used in said memory system for said memories.

2. The memory system defined by claim 1 including additional address signals which are coupled to said memory system for selecting between ones of said memories, said additional address signal and said second address signals identifying one of said lines in said memories, said additional address signals being coupled to said programmable memory.

3. The memory system defined by claim 2 wherein said programmable memory is a programmable read-only memory.

4. The memory system defined by claim 2 wherein said programmable memory is a content-addressable memory.

5. The memory system defined by claim 1 wherein said selection means selects among said memories by controlling an address timing signal.

6. The memory system defined by claim 1 wherein said selection means is a switching means coupled to the data lines of said memories.

7. In a memory system which includes a plurality of memories which are coupled to receive address signals for accessing said memories, an improvement which permits use of ones of said memories having defective elements comprising:

a memory means coupled to receive said address signals for providing predetermined address signals and a control signal in response to ones of said address signals corresponding to said defective elements of said memories;

an additional memory coupled to receive said predetermined address signals from said memory means; and, selection means for selecting either said memories or said additional memory, said selection means controlled by said control signal, so as to select said additional memory for said ones of said address signals corresponding to said defective elements of said memories;

whereby mostly good memories may be used in said memory system for said memories.

8. The memory system defined by claim 7 wherein said memory means comprises a content-addressable memory.

9. The memory system defined by claim 8 wherein said memory means is programmable.

10. The memory system defined by claim 7 wherein said memory system receives additional address signals for selecting between ones of said memories, said additional address signals being coupled to said memory means.

11. The memory system defined by claim 7 wherein each of said memories is disposed on separate substrates and wherein each substrate includes redundant elements.

12. The memory system defined by claim 7 wherein said selection means selects among said memories by controlling an address timing signal.

13. The memory system defined by claim 7 wherein said selection means is a switching means coupled to the data lines of said memories.

* * * * *